NEGATIVE FEED-BACK TRANSISTOR AMPLIFIER

Filed June 7, 1954

INVENTORS
JOHANNES ENSINK
JAN VERHAGEN
BY Fred M Vogel
AGENT 2,835,748

NEGATIVE FEED-BACK TRANSISTOR AMPLIFIER

Johannes Ensink and Jan Verhagen, Hilversum, Netherlands, assignors, by mesne assignments, to North American Philips Company, Inc., New York, N. Y., a corporation of Delaware Application June 7, 1954, Serial No. 434,914

Claims priority, application Netherlands June 9, 1953

5 Claims. (Cl. 179—171)

The present invention relates to a transistor amplifier circuit. More particularly, the invention relates to a negative feedback transistor amplifier comprising in succession at least one transistor of the non current amplifying type and a transistor of the current amplifying type, the signal to be amplified being supplied to the base electrode of the transistor of the non-current amplifying type. An object of the invention is to provide an extremely stable amplifier of the type described having greatly reduced distortion.

In accordance with the invention, the collector electrode of the transistor of the non current amplifying type is connected through a circuit passing direct current to the emitter electrode of the transistor of the current amplifying type and a negative feedback impedance is included in a circuit common to the emitter circuit of the transistor of the non current amplifying type and to the base circuit of the transistor of the current amplifying type.

In order that the invention may be readily carried into effect, it will now be described with reference to the accompanying drawing, in which.

Figure 1:
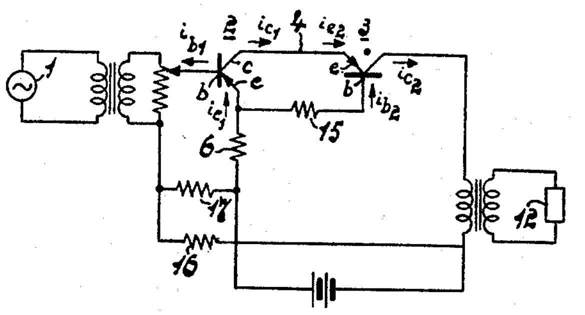
Fig. 1 is a schematic diagram of an embodiment of the amplifier circuit of the present invention.

According to Fig. 1 a signal to be amplified is supplied from a source 1 to the base electrode *b* of a transistor 2, for example a PNP junction transistor of the non current amplifying type. The transistor 2 is followed by a transistor, for example a point contact transistor 3, of the current amplifying type. The term "current amplifying type" is to be understood herein to mean that the ratio between the alternating collector current and the alternating emitter current of the corresponding transistor exceeds 1. The term "non current amplifying type" is understood herein to mean that this ratio is equal to or less than 1.

According to the invention, the collector electrode *c* of the transistor 2 is connected through a circuit passing direct current to the emitter electrode *e* of the transistor 3, and the common circuit connecting a supply source 5 to the emitter electrode *e* of the transistor 2 and to the base electrode *b* of the transistor 3, includes a negative feedback impedance 6. Consequently the negative feedback impedance 6 is traversed by a current which is substantially equal to the collector current of the transistor 3, so that the amplified signal, produced across an output impedance 12 included in the collector circuit of transistor 3 is substantially free from distortion. Since, moreover, all undue phase shifts are avoided, the amplifier is very stable, in spite of the fact that the impedance 6 produces positive feedback of the transistor 3.

Suitable values for the circuit elements used may be, for example as follows: impedance 6=a resistor of 50 ohms; resistor 15=400 ohms, resistor 16=12 kilohms, resistor 17=150 ohms.

Figure 2:
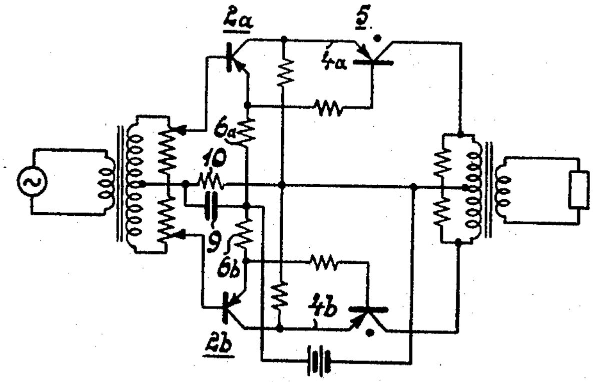
Fig. 2 is a modification of the embodiment of Fig. 1.

Fig. 2 is a modification of the embodiment of Fig. 1, in which two transistors of corresponding conductivity type of the kind shown in Fig. 1 are connected in push-pull arrangement. The bias base voltage of transistors *2a* and *2b*, which correspond to transistor 2 of Fig. 1, is produced by means of a common resistor 10, which may be bypassed by a capacitor 9.

Figure 3:
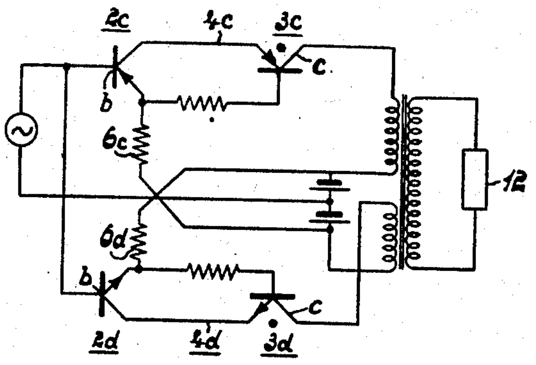
Fig. 3 is a modification of the embodiment of Fig. 2.

Fig. 3 is a modification of the embodiment of Fig. 2 and comprises a push-pull amplifier, in which the upper half of the amplifier corresponds to the embodiment of Fig. 1 and the lower half comprises transistors of a conductivity type opposite to that of said upper half. The signal oscillations are supplied in co-phase to the base electrodes *b* of the transistors 2c and 2d, which do not amplify the current. At the collector electrodes *c* of the transistors 3c and 3d, which amplify the current, push-pull amplified currents are produced. These currents are supplied in the correct phase to the load impedance 12.

The negative feedback impedances 6 of Fig. 1, 6a and 6b of Fig. 2, 6c and 6d of Fig. 3 respectively, shown in the form of resistors, may of course have a prescribed frequency-dependence, in order to obtain a frequency-dependent negative feedback. Moreover, the circuit 4 of Fig. 1, passing direct current, and the corresponding circuits 4a and 4b of Fig. 2 and 4c and 4d of Fig. 3, respectively, may include a plurality of transistors amplifying direct current and a plurality of impedances passing direct current respectively.

While the invention has been described by means of specific examples and in specific embodiments, we do not wish to be limited thereto, for obvious modifications will occur to those skilled in the art without departing from the spirit and scope of the invention.

What is claimed is:

1. A negative feedback transistor amplifier system comprising a first transistor of the non-current amplifying type and comprising a base, an emitter and a collector, a second transistor of the current amplifying type and comprising a base, an emitter and a collector, means for applying an input signal to the base of said first transistor, a direct current path interconnecting the collector of said first transistor and the emitter of said second transistor, means for energizing said transistors, means for connecting the emitter of said first transistor and the base of said second transistor in a common direct current circuit, a negative feedback impedance connected between a point on said common circuit and a terminal of said energizing means, and output circuit means coupled to the collector electrode of said second transistor.

2. A negative feedback transistor amplifier system comprising a first transistor of the non-current amplifying type and comprising a base, an emitter and a collector, a second transistor of the current amplifying type and comprising a base, an emitter and a collector, means for applying an input signal to the base of said first transistor, a direct current path interconnecting the collector of said first transistor and the emitter of said second transistor, means for energizing said transistors, a direct current path comprising an impedance element interconnecting the emitter of said first transistor and the base of said second transistor, means for connecting said last-mentioned direct current path to said energizing means comprising a negative feedback impedance connected between a point on the said path and a terminal of said energizing means, and output circuit means connected to the collector of said second transistor.

3. A negative feedback transistor amplifier system comprising two signal paths arranged in push-pull relationship, each of said paths comprising a first transistor of the non-current amplifying type having a base, an emitter and a collector, a second transistor of the current amplifying type having a base, an emitter and a collector, a direct current path interconnecting the collector of said first transistor and the emitter of said second transistor, a direct current path comprising an impedance element interconnecting the emitter of said first transistor and the base of said second transistor, means for energizing said transistors, means for connecting said last-mentioned direct current path to said energizing means comprising a negative feedback impedance connected between a point on the said path and a terminal of said energizing means, means for applying an input signal in push-pull relationship to the bases of the first transistors of said signal paths, and push-pull output circuit means connected to the collectors of the second transistors of said signal paths.

4. A negative feedback transistor amplifier system comprising two signal paths defining a push-pull amplifier, each of said paths comprising a first transistor of the non-current amplifying type having a base, an emitter and a collector, a second transistor of the current amplifying type having a base, an emitter and a collector, a direct current path interconnecting the collector of said first transistor and the emitter of said second transistor, a direct current path comprising an impedance element interconnecting the emitter of said first transistor and the base of said second transistor, means for energizing said transistors, means for connecting the emitter of said first transistor and the base of said second transistor in a common direct current circuit to said energizing means, a negative feedback impedance connected in said common circuit, the transistors of one of said signal paths being of a given conductivity type and the respective transistors of the other of said signal paths being of the opposite conductivity type, means for applying an input signal in the same phase relationship to the bases of the first transistors of said signal paths, and push-pull output circuit means connected to the collectors of the second transistors of said signal paths.

5. An amplifying circuit arrangement comprising a first junction type transistor and a second point contact type transistor each having an emitter electrode, a collector electrode and a base electrode, means for applying an input signal to the base electrode of said first transistor, means directly interconnecting the collector electrode of said first transistor and the emitter electrode of said second transistor, a common direct current circuit interconnecting the emitter electrode of said first transistor and the base electrode of said second transistor, means for energizing said transistors, a negative feedback impedance, and output circuit means connected in series circuit arrangement with said energizing means and said negative feedback impedance, said series circuit arrangement being connected between a point on said common circuit and the collector electrode of said second transistor.

References Cited in the file of this patent

UNITED STATES PATENTS

| | | |
|---|---|---|
| 2,647,958 | Barney | Aug. 4, 1953 |
| 2,662,124 | McMillan | Dec. 8, 1953 |
| 2,730,576 | Caruthers | Jan. 10, 1956 |

OTHER REFERENCES

Shea text, Principles of Transistor Circuits, pages 349–351, published 1953 by John Wiley & Sons, Inc., N. Y. city.

Sziklai et al.: Article, Proceedings IRE, June 1953, pages 708–710.